US007129881B2

(12) United States Patent
Franz

(10) Patent No.: US 7,129,881 B2
(45) Date of Patent: Oct. 31, 2006

(54) PIPELINE ANALOG TO DIGITAL CONVERTER

(75) Inventor: Bernd Franz, Brackenheim (DE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/934,537

(22) Filed: Sep. 7, 2004

(65) Prior Publication Data

US 2005/0062635 A1 Mar. 24, 2005

(30) Foreign Application Priority Data

Sep. 23, 2003 (EP) ................................. 03292327

(51) Int. Cl.
*H03M 1/38* (2006.01)
(52) U.S. Cl. ........................ 341/161; 341/120; 341/162
(58) Field of Classification Search ................ 341/161, 341/162, 118, 155, 120, 138; 370/441; 398/79
See application file for complete search history.

(56) References Cited

U.S. PATENT DOCUMENTS

| 3,646,548 | A | * | 2/1972 | Van Doren ................. 341/138 |
| 4,326,192 | A | | 4/1982 | Merrill et al. |
| 4,375,059 | A | * | 2/1983 | Schlig ........................ 341/162 |
| 5,572,212 | A | * | 11/1996 | Levinson et al. ........... 341/162 |
| 5,668,549 | A | * | 9/1997 | Opris et al. ................. 341/118 |
| 5,841,776 | A | * | 11/1998 | Chen ......................... 370/441 |
| 6,028,546 | A | * | 2/2000 | Signell et al. .............. 341/161 |
| 6,140,949 | A | * | 10/2000 | Tsay et al. .................. 341/120 |
| 6,169,502 | B1 | * | 1/2001 | Johnson et al. ............ 341/120 |
| 6,195,032 | B1 | * | 2/2001 | Watson et al. ............. 341/162 |
| 6,222,478 | B1 | * | 4/2001 | Bright ........................ 341/162 |
| 6,341,023 | B1 | * | 1/2002 | Puc ............................ 398/79 |
| 6,366,230 | B1 | * | 4/2002 | Zhang et al. ............... 341/162 |
| 6,396,429 | B1 | * | 5/2002 | Singer et al. ............... 341/155 |
| 6,417,965 | B1 | * | 7/2002 | Ye et al. ................. 359/341.41 |
| 2005/0219109 | A1 | * | 10/2005 | Kobayashi et al. |

OTHER PUBLICATIONS

Hui Liu et al: "High speed re-configurable pipeline ADC cell design" IEEE, Feb. 25, 2001, pp. 158-161, XP010537973.
Guilherme J et al: "New CMOS Loarithmic A/D converters employing pipeline and algorithmic architectures" 1995 IEEE International Symposium on Circuits and Systems (ISCAS). Seattle, Apr. 30-May 3, 1995, New York, IEEE, US vol. 1, Apr. 30, 1995, pp. 529-532, XP000583275.

* cited by examiner

*Primary Examiner*—Jean Bruner Jeanglaude
(74) *Attorney, Agent, or Firm*—Sughrue Mion, PLLC

(57) ABSTRACT

The pipeline analog-to-digital converter has a number of subsequent comparator stages (2) where the thresholds of the comparator stages are adjusted in accordance with the digital conversion results from previous stages (18, 28, 38) so as to implement a non-linear conversion scale. In particular, the pipeline analog-to-digital converter consists of a number of comparator stages (2), which operate in accordance with a common clock signal. The comparator stages are connected in series in such a way that a residue signal from a previous stage is used as input signal of a subsequent stage for comparison during the next clock period of the clock signal. At least some of said comparator stages have, according to the invention, a threshold generator (25, 35, 45) for adjusting the threshold value of the respective comparator (22, 32, 42) in accordance with comparison results of previous comparator stages (18, 28, 38).

6 Claims, 1 Drawing Sheet

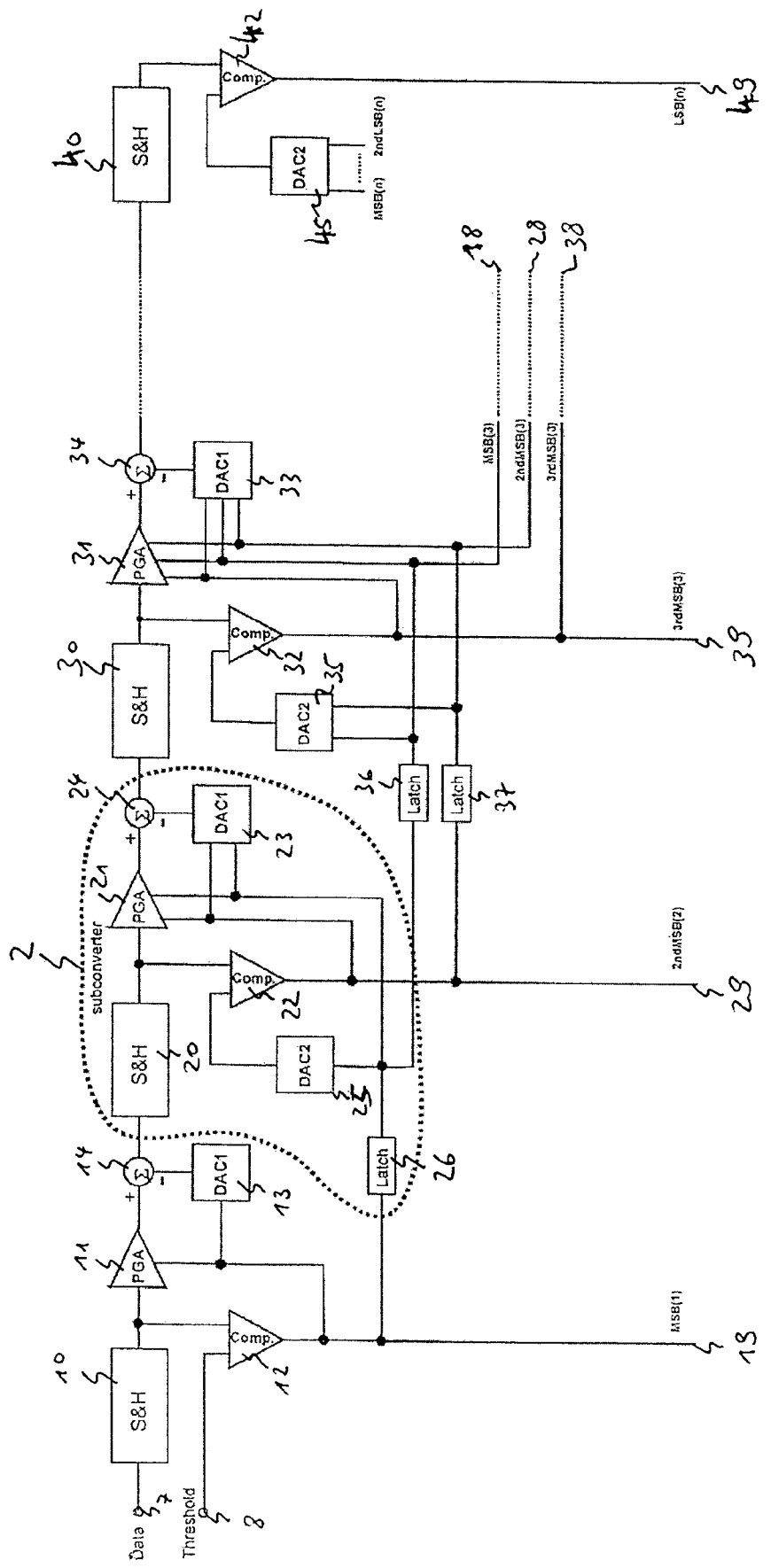
Figure

PIPELINE ANALOG TO DIGITAL CONVERTER

The invention is based on a priority application EP 03 292 327.8 which is hereby incorporated by reference.

BACKGROUND OF THE INVENTION

The present invention relates to the field of electronics and more particularly to an analog-to-digital converter as it may be used in telecommunications applications such as receivers for long-haul optical signal transmission.

Digital optical signals traversing an optical fiber link are subject to distortion and noise which may produce bit errors at the receiver side. At higher transmission rates or longer span lengths, error correction may thus be performed at the receiver side to reduce the error rate of distorted signals. A known method of error correction, the Maximum Likelihood Sequence Estimation (MLSE) reducing errors caused by inter-symbol interference (ISI), uses a Viterbi decoder. Viterbi decoders require analog to digital conversion of received optical signal after signal detection in a photodiode.

Most analog to digital converters (ADC) follow a linear scale, i.e. the scale for a given bit resolution is subdivided in equidistant steps per bit. A linear ADC is also the best choice for correcting a noisy input signal with a signal independent noise characteristic like additive white Gaussian noise. Optical noise, however, is signal dependent and therefore the optimum characteristic of the analog-to-digital converter (ADC) is no more linear. It would thus be preferable to use a ADC that follows a non-linear scale in Viterbi decoders for optical applications.

U.S. Pat. No. 6,417,965 discloses an optical amplifier control system that uses a non-linear analog-to-digital converter with a logarithmic scale but does not show an implementation of such an ADC.

It would be possible to implement a parallel ADC with a non-linear characteristic, because the thresholds of the comparators in the parallel ADC would be individually adjustable and could thus be adjusted according to a non-linear scale. The complexity of parallel ADC, however, grows with the square of the bit resolution n of the ADC (i.e., with $2^n-1$). The complexity of a ADC with a resolution of 4 bit or more is therefore too high to allow a cost effective implementation. Moreover, parallel ADCs have a relatively high input capacity so that they are not well suited for high-frequency applications of 2 GHz or above.

It is thus an object of the present invention to provide an analog-to-digital converter that follows a non-linear scale and that has a lower complexity and allows operation at frequencies of 2 GHz and more.

SUMMARY OF THE INVENTION

These and other objects that appear below are achieved by a pipeline analog-to-digital converter with a number of subsequent comparator stages where the thresholds of the comparator stages are adjusted in accordance with the digital conversion results from previous stages.

In particular, the pipeline analog-to-digital converter consists of a number of comparator stages, which operate in accordance with a common clock signal. Each of the comparator stages contains a comparator for comparing an input signal with a respective threshold signal. The first comparator stages each contain a subtracter for generating a residue signal for the subsequent stages.

The comparator stages are connected in series in such a way that the residue signal from a previous stage is used as input signal of a subsequent stage for comparison during the next clock period of the clock signal. At least some of said comparator stages have, according to the invention, a threshold generator for adjusting the threshold value of the related comparator in accordance with comparison results of previous comparator stages.

The pipeline ADC according to the invention has thus a programmable characteristic and can be programmed to implement any conversion scale including a non-linear scale.

BRIEF DESCRIPTION OF THE DRAWINGS

A preferred embodiment of the present invention will be described below with reference to the accompanying drawing in which the sole figure shows a circuit diagram a non-linear ADC according to the invention.

Conventional pipeline ADCs are based on the principle of sequential or "step-by-step" conversion. The analogue signal to be converted is first sampled in a sample-and-hold circuit (S&H) and compared with a threshold in a first stage comparator. This comparison result is the most significant bit. The signal is than amplified by an amplification factor of 2 and the bit value of the first stage subtracted therefrom. The result is the residue signal for the second stage. In the second stage comparator, the residue signal is sampled again by a second-stage sample-and-hold circuit and compared in a second-stage comparator with a threshold value to determine the second most significant bit. This sequential process continues in subsequent stages up to the required bit resolution.

An underlying principle is to generate a residue signal that lies within a sub-range of the original conversion range and spread this sub-range up to the full range of the subsequent stage by amplification. Assume the conversion range of the first stage is between 0 and 1 and the threshold 0.5. The residue signal lies then in the range between 0 and 0.5 and is amplified with the factor of two to spread it up again to the full range of 0 to 1 of the subsequent stage. This implies, however, a linear conversion scale.

A basic idea of the present invention, however, is to make the thresholds of the individual comparator stages adjustable and adjust them in accordance with the comparison result from the previous stages in order to implement a non-linear scale.

The sole figure shows a preferred embodiment such a non-linear ADC. The analog signal to be converted is applied to signal input 7. A first stage sample-and-hold (S&H) circuit 10 samples the analog value and holds it for one clock period (clock related issues are not shown in the circuit diagram but would be apparent to and could thus easily be added by those skilled in the art). The sampled value is then compared in a first stage comparator 12 with an external threshold value from threshold input 8. The result from the comparison is the most significant bit available at lead 19. A programmable gain amplifier (PGA) 11 amplifies the value hold by S&H circuit 10. A digital-to-analog converter (DAC1) 13 converts the most significant bit value into a signal value to be subtracted from the amplified signal value from PGA 11 to determine a residue signal for the second comparison stage 2. A subtracter 14 subtracts the converted signal coming from DAC1 13 from the amplified signal coming from PGA 11. The result is the residue signal which is forwarded to the second stage, which determines therefrom during the next clock cycle the second most significant bit.

Similar to the first stage, the second stage 2 contains a S&H circuit 20, a comparator 22, a programmable gain amplifier 21 and a subtracter 24. The second stage receives the residue signal from the first stage and the comparison result, i.e., the most significant bit value, which is 1 or 0. This bit value is stored for one clock period in a digital latch 26 and fed to a second digital-to-analog converter (DAC2) 25, which generates therefrom a threshold value for the comparison in comparator 22. The DAC2 25 thus operates as threshold generator and adjusts the threshold of the comparator 22 in order to implement a non-linear scale.

The bit value stored by latch 25 is further fed to PGA 21 and DAC1 23, to adapt the amplification factor of PGA 21 and the conversion factor of DAC1 23. Lead 29 of the second stage delivers the second most significant bit value, but one clock period later than the corresponding most significant bit at lead 19.

The third comparison stage is similar to the second stage. It contains an S&H circuit 30, PGA 31, comparator 32, DAC1 33, subtracter 34, DAC2 35. As according to the invention, the threshold value of the comparator has to be adapted according to the results of the previous comparator stages, the result from the second stage as well as the result from the first stage, which is still available from latch 26 of the second stage, are fed to the third stage. The third stage thus contains two latches 36 and 37 to store the comparison results, i.e., the most significant bit from stage one and the second most significant bit from stage two for another clock period. The comparison result from the third stage, i.e., the third most significant bit is then available at lead 39, but delayed by one clock period as compared to the second most significant bit at lead 29 and by two clock periods as compared to the most significant bit at lead 19. It should be noted, however, that latches 36, 37 and the output at lead 39 supplies the bit values of the some sample from all subsequent stage at the same time. These values and the residue signal from stage three are then fed to the fourth comparison stage, which is the last stage in the preferred embodiment. Dotted lines in the figure indicate that there may be a number of further comparison stage between the third and the last stage, depending on the required bit resolution. For most applications in Viterbi decoders, four bit resolution would be sufficient, but could easily increased with further comparison stages of similar design.

The fourth and last comparison stage contains only a S&H circuit 40, comparator 41, DAC2 45 and three latches (not shown) to store the comparison results from the previous stages for one clock period. PGA, subtracter, and DAC1 are not required, as the last stage does not need to generate a residue signal for a subsequent stage. Lead 49 supplies the least significant bit value, while all more significant bit values are available from the not shown latches of the last stage.

The DACs can be implemented as switched constant current sources, as resistor circuit or by any other known digital-to-analog converter circuit. The subtracter can be implemented with a differential amplifier with a gain equal to 1.

The operation of an ADC according to the invention will now be described by way of an example that implements a square characteristic. The example uses a resolution of 4 bits, as shown in the circuit diagram of the figure. Assuming a conversion range from 0 V to 1 V, the bit intervals (rounded to five digits) that corresponds to the first three most significant bits are as follows:

| Digital value | from (V) | to (V) |
| --- | --- | --- |
| 000 | 0.0000 | 0.0156 |
| 001 | 0.0156 | 0.0625 |
| 010 | 0.0625 | 0.1406 |
| 011 | 0.1406 | 0.0250 |
| 100 | 0.0250 | 0.3906 |
| 101 | 0.3906 | 0.5625 |
| 110 | 0.5625 | 0.7656 |
| 111 | 0.7656 | 1.0000 |

The value of the input signal to be converted in the example is 0.37 V. The threshold value T1 for the first-stage comparator 12 is set to 0.25 (i.e., $(4/8)^2$). The comparison yields a logical 1 because 0.37 is larger than 0.25. The output at least 19 is thus '1'. The input signal lies in the range between 0.25 and 1. This range has now to be spread to the full range of the second comparator stage. Therefore, the gain G1 of PGA 11 is set to $$G1=1/(1-0.25)=1.333$$

In order to determine the residue signal for the next stage, the value corresponding to the most significant bit must be subtracted from the amplified signal output of PGA 11. DAC1 13 generates the signal value to be subtracted. This value is the product of the most significant bit value, the threshold, and the amplifier gain G1, i.e., '1'*0.25*1.333. The residue signal for the second comparator stage is thus 0.16.

The threshold T2 of the second-stage comparator 22 as it is generated by DAC2 25 is $$T2=(0.5625-0.25)*G1=0.4167$$

As the residual value is less than the second-stage threshold, the second most significant bit available at output lead 29 is '0'. The gain G2 of PGA 21 is set to $$G2=(1-0.25)/(0.5625-0.25)=2.4$$

The value from DAC1 is '0'*G2*(0.5625−0.25)/(1−0.25) =0. The residue value is thus 0.16*G2=0.384, which is fed to the third comparator stage.

DAC2 35 from the third comparator stage generates the threshold T3 for comparator 32 as follows:

$$T3=(0.3906-0.25)/(0.5625-0.25)=0.4499$$

As 0.384 is less than the threshold T3 of 0.4499, the third most significant bit is '0'. The gain G3 of PGA 31 is set to $$G3=(0.5625-0.25)/(0.3906-0.25)=2.2226$$

The output of DAC1 33 is '0'*G3*(0.3906−0.25)/ (0.5625−0.25)=0. The residue signal for the fourth comparator stage is 0.8535. The threshold T4 of DAC2 45 for the fourth-stage comparator 42 is set to $$T4=((9/16)^2-0.25)/(0.3906-0.25)=0.4723$$

The least significant bit value is thus '1'.

The example pipeline ADC with square characteristic thus represents the value 0.37 as 1001 (bin), i.e. as 9(dec).

The above described ADC is used in an optical receiver. The receiver contains an optical-to-electrical converter such as a photodiode, which is connected to an optical fiber input and generates an analog electrical signal from a received distorted optical signal. After amplification in an AGC to a voltage level equal to the dynamic range of the ADC the analog electrical signal, which represents the distorted and noisy data, is then fed to the ADC for conversion to a digital signal according to a non-linear conversion scale. The digital signal is then fed to a Viterbi decoder, which determines therefrom a regenerated digital signal, which represents with maximum propability the original transmitted data. Viterbi decoders are known as such in the art.

Having described design and operation of a preferred embodiment of the invention, it should be clear to those skilled in the art, that various modifications and substitutions would be possible without departing from the concept of the invention. The subtracter, for example, can be locate in front of the programmable gain amplifier rather than behind. This may be attractive at lower speed applications but may not suffice the needs at higher clock rates of 10 GHz and above because the DACs would require time to settle the voltage signal to be subtracted so that it may be advantageous to amplify the signal first and subtract the signal corresponding to the bit value thereafter as shown in the embodiment.

The invention claimed is:

1. A pipeline analog-to-digital converter comprising a number of comparator stages operating in accordance with a clock signal, each of said comparator stages comprising a comparator for comparing an input signal with a respective threshold signal and at least some of said comparator stages comprising a subtracter for generating a residue signal; the comparator stages being connected in series in such a way that the residue signal from a previous stage is used as input signal of a subsequent stage for comparison during the next clock period of the clock signal; wherein at least some of said comparator stages comprise a threshold generator for adjusting the threshold value of the related comparator in accordance with comparison results of previous comparator stages, and a programmable gain amplifier for amplifying the residue signal from the related stage in accordance with the comparison results of previous comparator stages.

2. A pipeline analog-to-digital converter according to claim 1, wherein the residue signal from a previous comparator stage lies within a sub-range of the full comparator range and wherein the gain of the programmable gain amplifier of said previous comparator stage is adjusted to spread said sub-range to the full range of the subsequent comparator stage.

3. A pipeline analog-to-digital converter according to claim 1, wherein said subtractors being located behind said programmable gain amplifiers and wherein each of said subtractors being connected to an associated digital-to-analog converter, which generates from the comparison results of previous comparator stages a signal to be subtracted.

4. A pipeline analog-to-digital converter according to claim 1, wherein at least some of said comparator stages comprising latches for storing the comparison results of previous comparator stages for the duration of one clock period.

5. A method of converting an analog signal to a digital signal comprising the steps of:

providing a number comparator stages connected in series and operating in accordance with a clock signal;

adjusting threshold values of at least some of said comparator stages in accordance with earlier comparison results of previous comparator stages;

comparing in each comparator stage an input signal with a respective threshold signal;

in at least some of said comparator stages, generating a residue signal and feeding this residue signal as input signal to a subsequent stage for comparison during the next clock period of the clock signal; and in at least some of said comparator stages, amplifying the residue signal with a programmable gain amplifier in accordance with a comparison result of a previous comparator stage.

6. An optical receiver for a long-haul optical transmission system, said receiver comprising an optical-to-electrical converter for converting a received optical signal to an analog electrical signal, a pipeline analog-to-digital converter for converting said analog electrical signal to a digital signal according to a non-linear conversion scale, and a Viterbi decoder, for processing said digital signal; wherein said pipeline analog-to-digital converter comprises a number of comparator stages operating in accordance with a clock signal, each of said comparator stages comprising a comparator for comparing an input signal with a respective threshold signal and at least some of said comparator stages comprising a subtracter for generating a residue signal; said comparator stages being connected in series in such a way that the residue signal from a previous stage is used as input signal of a subsequent stage for comparison during the next clock period of the clock signal; and wherein at least some of said comparator stages comprise a threshold generator for adjusting the threshold value of the related comparator in accordance with comparison results of previous comparator stages, and a programmable gain amplifier for amplifying the residue signal from the related stage in accordance with the comparison results of previous comparator stages.

* * * * *